United States Patent [19]
Holmes

[11] Patent Number: 6,040,699
[45] Date of Patent: Mar. 21, 2000

[54] MOUNTING APPARATUS FOR VECTORLESS TESTING

[75] Inventor: Frederick J. Holmes, Plainville, Mass.

[73] Assignee: Semco Machine Corporation, Wrentham, Mass.

[21] Appl. No.: 08/877,032

[22] Filed: Jun. 16, 1997

[51] Int. Cl.$^7$ .................................................. G01R 31/22
[52] U.S. Cl. .......................................... 324/754; 73/866.5
[58] Field of Search ..................................... 327/754, 758, 327/755, 158.1, 73.1; 73/866.5, 865.8; 269/60, 110, 114, 203

[56] References Cited

U.S. PATENT DOCUMENTS

| | | | |
|---|---|---|---|
| 4,363,991 | 12/1982 | Carbine .................................... | 324/754 |
| 4,383,217 | 5/1983 | Shiell ....................................... | 324/754 |
| 4,688,437 | 8/1987 | Becker et al. ........................... | 73/866.5 |
| 5,003,254 | 3/1991 | Hunt et al. .............................. | 324/754 |

*Primary Examiner*—Vinh P. Nguyen
*Attorney, Agent, or Firm*—John A. Haug

[57] ABSTRACT

A mounting device (10) is shown particularly adapted for adjustably mounting vectorless test heads for circuit board components and the like to be tested for processing faults of component pin connections with traces of a circuit board in which the components are mounted. A U-shaped bracket (18) is lockably received on a rail (2) and has first and second projections (18d,18e) slidably received through a respective slot (16c,16d) of a leg (16) of a T-shaped member (12). The base leg (14) of the T-shaped member (12) is connected to one end of a pin member (24) which slides through a bore (18p) in one arm (18b) of U-shaped bracket (18) and is threadingly received in a threaded bore (18n) of the other arm (18a) of the U-shaped bracket (18). Rotational movement of the pin member (24) causes T-shaped member (12) to move in a Z direction to permit precise locating of a test head (30) mounted on the base leg (14). The mounting device (10) is also shown mounted on a resinous mounting plate (40) having a plurality of sets (40a) of mounting apertures.

16 Claims, 6 Drawing Sheets

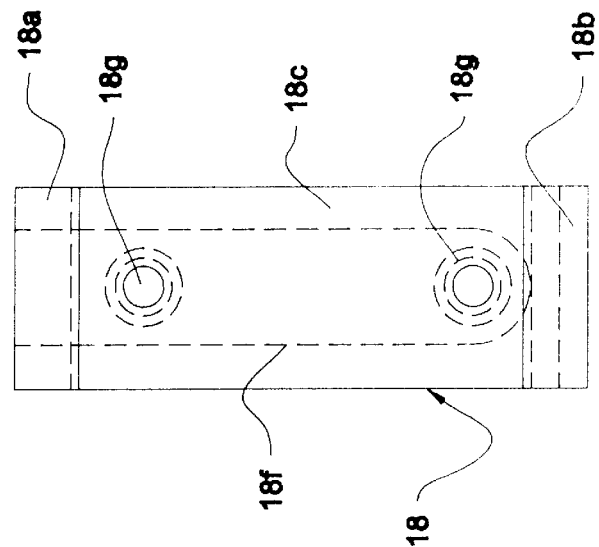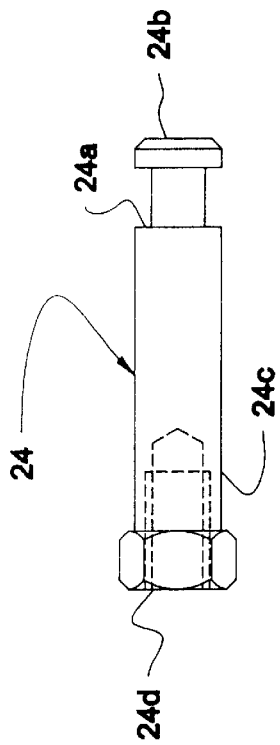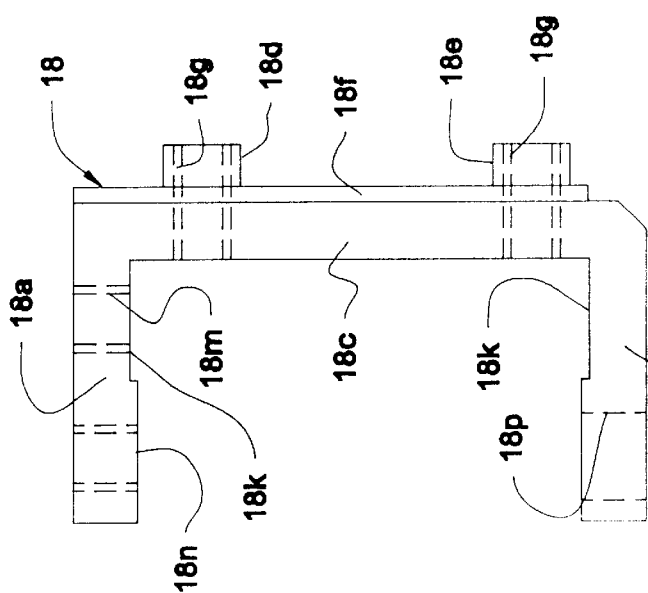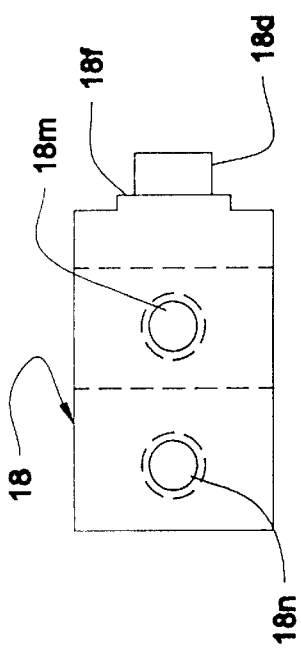

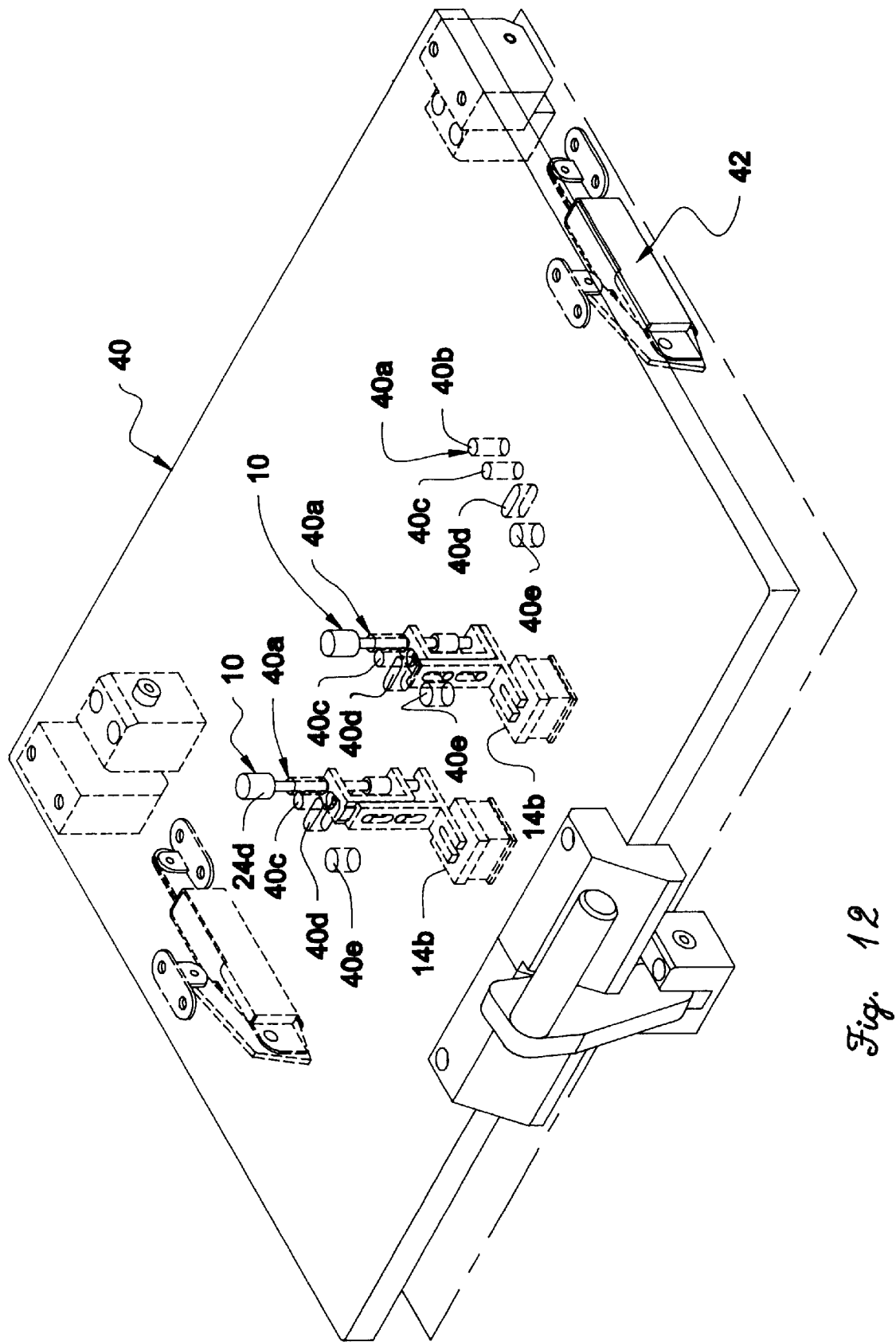

MOUNTING APPARATUS FOR VECTORLESS TESTING

FIELD OF THE INVENTION

This invention relates generally to the testing of integrated circuit (IC) components, circuit boards, connectors and the like for pin processing faults and more particularly to an improved mechanism for mounting test heads employed in conducting such tests.

BACKGROUND OF THE INVENTION

It is conventional to test the integrity of soldered pin connections of IC components with traces on a circuit board and the like by mounting such boards in a test fixture and positioning test heads of various types in overlying, closely adjacent relationship to the components to be tested. A typical circuit board to be tested has anywhere from 20 to 40 or more test heads which must be mounted in very precise locations relative to the components to be tested in the X, Y and Z axes, i.e., in three directions perpendicular to one another. For example, when using vectorless testing techniques, such as a magnetic inductive test or capacitive coupling test, the test head, comprising a magnetic inducer or a capacitive probe respectively, is placed directly over the component under test and positioned no more than a selected distance, such as 0.010–0.020 inches from the component. As seen in FIG. 1, each test head (1) is mounted on a bracket 4 which is suspended from any one of a plurality of rails 2 movably mounted in an X direction (slots 6) over the mounting surface and circuit board CB mounting the component. The bracket typically is adjustably attached to the rail in the Y and Z directions by using one or more screw members 5. Due to the precise locating requirements of the test head, it is not unusual for a skilled technician to take the better part of a man-day to complete a typical set-up. A common time consuming problem occurs when an adjustment to the position of one of the heads must be made after a test set up has been largely completed. In order to get at the screws of the test head to be adjusted, an adjacent rail may have to be moved due to spatial limitations causing the heads on that rail to move out of position thereby adding to the already long set up-time to thereafter reposition the test heads.

SUMMARY OF THE INVENTION

It is an object of the present invention to provide mounting apparatus particularly adapted for vectorless testing of solder connections of IC components and the like on circuit boards which overcomes the prior art limitations noted above. Another object of the invention is the provision of a vectorless test head and improved mounting apparatus which is relatively inexpensive yet reliable and accurate, in which the Y and Z positions of the test head can be easily and precisely adjusted, and particularly without interference from the mounting mechanisms of neighboring test heads. Yet another object is the provision of an improved mounting device for mounting sensors, transducers, tools or other small objects which can be easily adjusted in a vertical, or Z, direction.

Briefly, in accordance with a preferred embodiment of the invention, a generally T-shaped member, preferably formed of suitable moldable plastic material such as polyvinylchloride, has a first laterally extending base leg and a second slide leg extending therefrom intermediate the ends of the first leg. Suitable apertures, such as slots, are formed at opposed ends of the first leg for mounting a pin member and the test head respectively. The second slide leg is formed with first and second elongated slots extending along the length of the second leg. A generally U-shaped bracket of suitable material, such as aluminum, has first and second arms extending from a bight portion with the bight portion disposed on one face surface of the second leg and with a pair of slide projections on the bight portion received through respective slots in the second slide leg of the T-shaped member. The slide projections are provided with heads which extend over a portion of the opposed face surface of the second slide leg to slidingly couple the T-shaped member and the U-shaped bracket together. Preferably, a tongue and groove arrangement is formed between the T-shaped member and the bracket as by forming a tongue along the length of the bight portion which is slidingly received in a groove formed in the said one face surface of the second leg and extends along the length of the second leg. A pin member is attached to the first leg of the T-shaped member as by forming the pin member with an annular groove adjacent one end of the pin member with the groove received in the slot at one end of the first leg of the T-shaped member. The pin member is slidingly received through a bore formed at the distal end of the lower arm of the U-shaped bracket and a threaded portion extending from the pin member along the longitudinal axis thereof is threadingly received in a first threaded bore formed in the distal end of the upper arm of the bracket. A knob is preferably provided at the free end of the threaded portion to facilitate adjusting rotation of the pin member. Preferably, a lock nut is disposed on the threaded portion between the knob and the U-shaped bracket. Rotational movement of the pin member will cause relative movement of the bracket and the T-shaped member. Preferably a compression spring is disposed about the threaded portion between the body of the pin member and the bracket to place a force on the pin member so that the threaded portion is always biased against the thread in the bracket arm in the same direction to provide consistent positioning of the first leg of the T-shaped member relative to the rotational angle of the pin member regardless of the direction of rotation.

According to a feature of the invention, a rail seat is formed between the first and second arms of the bracket and a second threaded bore is formed through the upper arm of the bracket aligned with the seat. A set screw is received in the second threaded bore to lock the bracket in any selected x position along a rail received in the seat. A suitable test head, for example a magnetic inducer or a capacitive probe, is disposed on the lower surface of the first leg of the T-shaped member and attached thereto by suitable means such as screws received through a slot in the first leg.

According to another feature of the invention, instead of mounting the devices on rails, a sheet of resinous material such as Lexan or Plexiglass may be provided with a plurality of sets of apertures which can be used to mount devices in various X-Y locations.

Additional objects and features of the invention will be set forth in part in the description which follows and in part will be obvious from the description. The objects and advantages of the invention may be realized and attained by means of the instrumentalities, combinations and methods particularly pointed out in the appended claims.

BRIEF DESCRIPTION OF THE DRAWINGS

The accompanying drawings, which are incorporated in and constitute a part of the specification, illustrate a preferred embodiment of the invention and, together with the description, serve to explain the objects, advantages and principles of the invention. In the drawings:

FIG. 7 is a front elevational view of a U-shaped bracket used in the FIGS. 2, 3 mounting device;

FIG. 8 is a top view of the FIG. 7 bracket;

FIG. 9 is a side elevational view of the FIG. 7 bracket;

FIG. 10 is an elevational view of a pin member used in the FIGS. 2, 3 device;

FIG. 12 is a perspective view showing a resinous mounting plate having a plurality of sets of mounting apertures especially adapted for mounting the FIGS. 2, 3 mounting devices in various selected X-Y positions.

DETAILED DESCRIPTION OF THE PREFERRED EMBODIMENT

Figure 2:
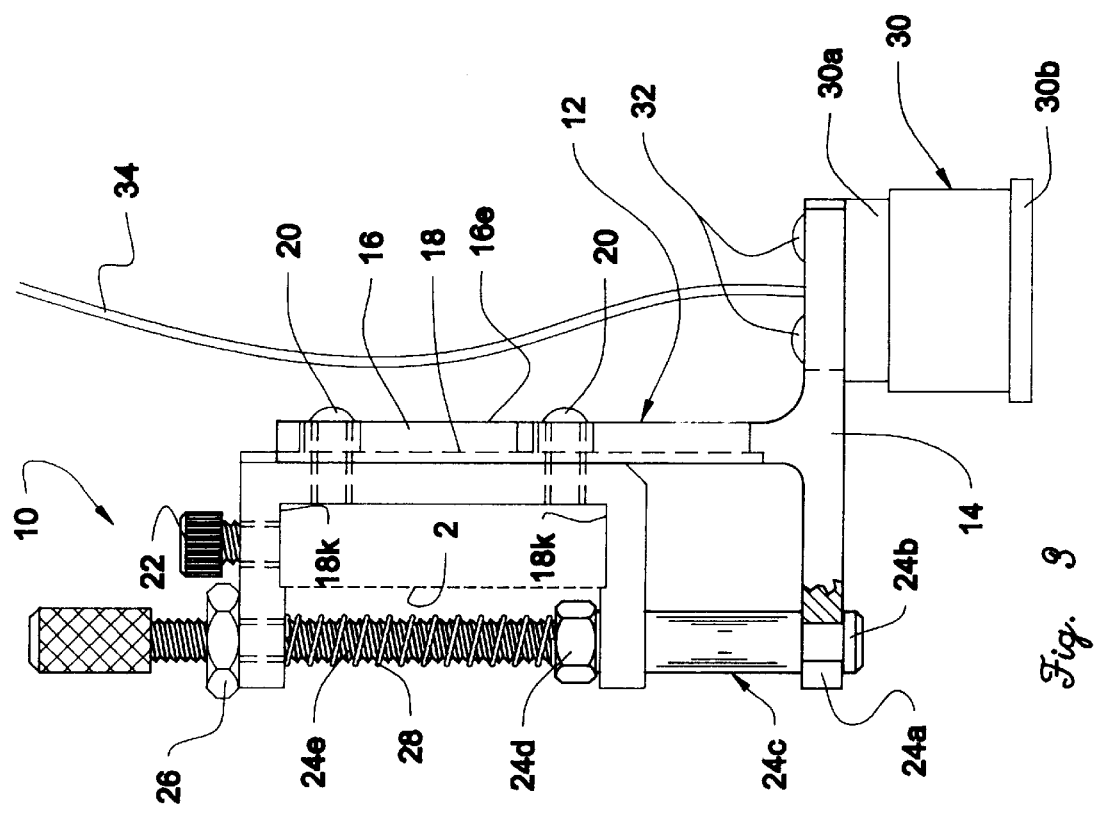
FIG. 2 is a front elevational view of a mounting apparatus made in accordance with the invention with the test head shown at one extreme Z position.
Figure 3:
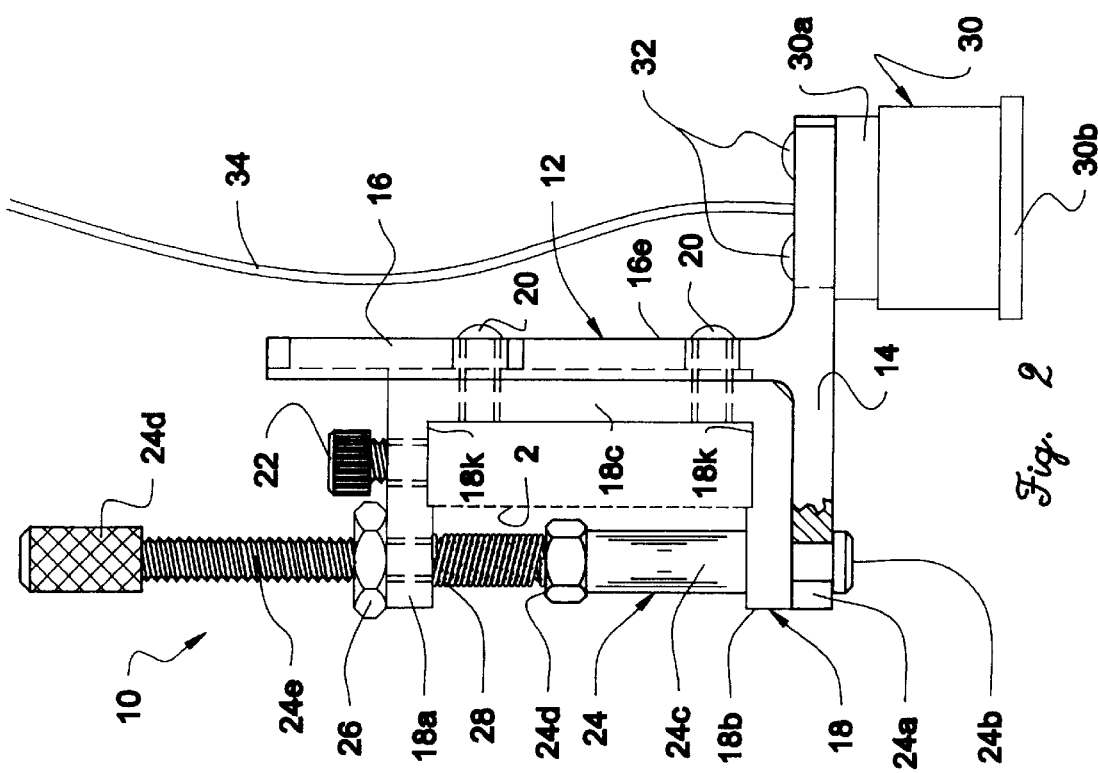
FIG. 3 is a front elevational view similar to FIG. 2 showing the mounting apparatus with the test head at an opposite extreme Z position.
Figure 4:
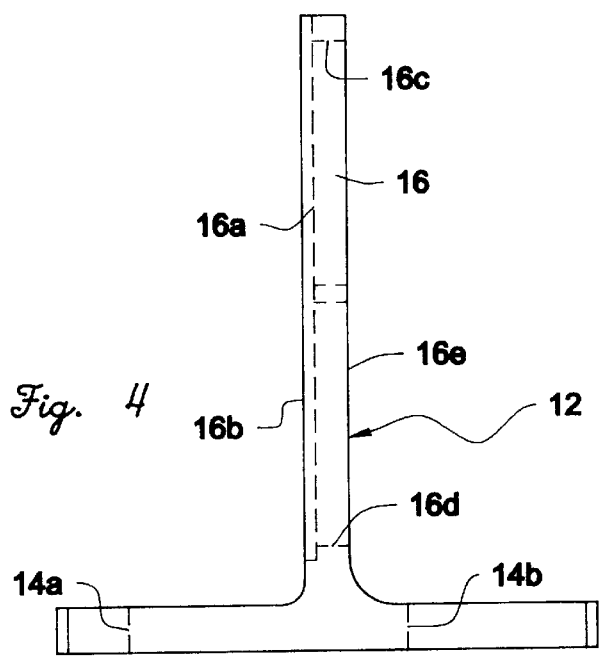
FIG. 4 is a front elevational view of a T-shaped member used in the FIGS. 2, 3 device.
Figure 6:
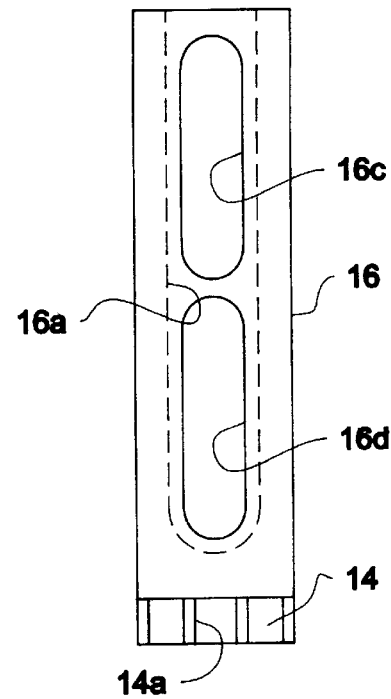
FIG. 6 is a side elevational view of the FIG. 4 member.
Figure 5:
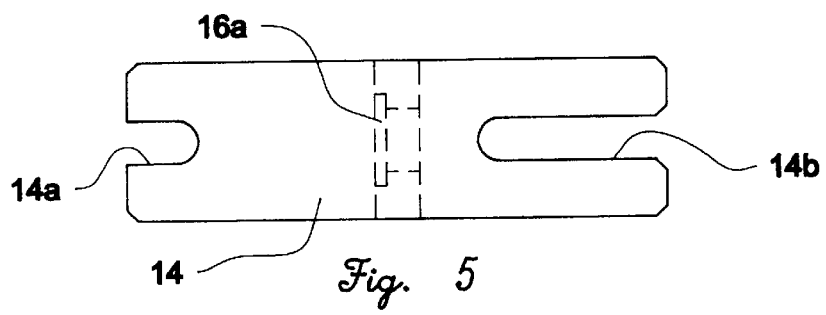
FIG. 5 is a bottom view of the FIG. 4 member.

Mounting device 10, made in accordance with a preferred embodiment of the invention and shown in FIGS. 2, 3, comprises a generally T-shaped member 12 preferably formed of a moldable plastic material such as polyvinylchloride. Member 12, shown also in FIGS. 4–6, has a first base leg 14 with slots 14a,14b, formed in opposite ends of the leg and an integrally formed second leg 16 extending away from leg 14 intermediate the ends thereof. Leg 16 is preferably formed with centrally disposed, elongated groove 16a on one face surface 16b extending essentially the entire length of leg 16. First and second elongated slots 16c and 16d extend through leg 16 from groove 16a to face surface 16e for a purpose to be described below.

Figure 1:
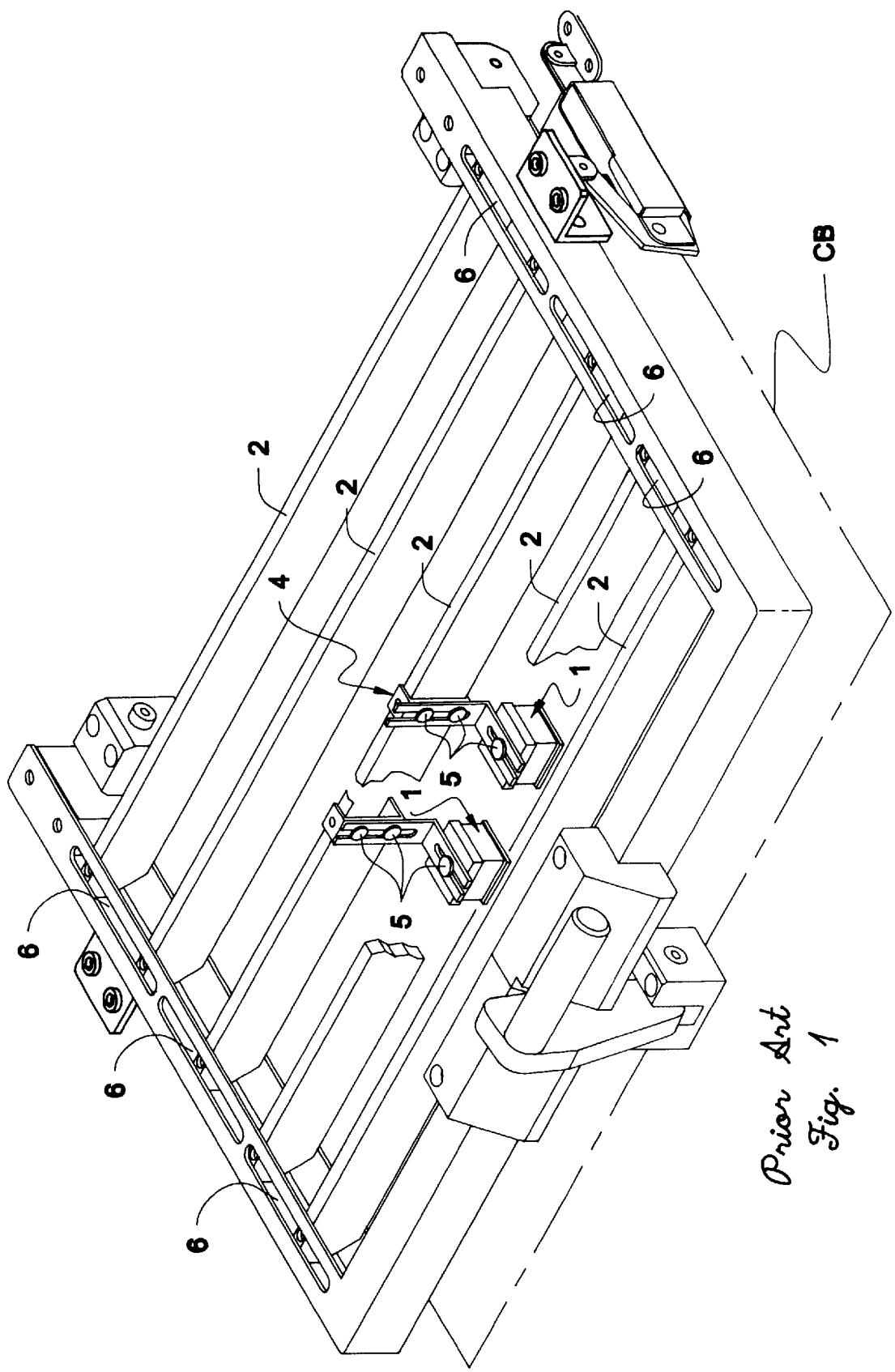
FIG. 1 is a perspective view of a conventional test fixture mounting a plurality of rails used to suspend test heads over components to be tested on a circuit board or the like in which test heads are mounted on a rail in a conventional manner, only two such heads being shown for purposes of illustration.

A generally U-shaped mounting bracket 18 (see FIGS. 7–9) having a first upper arm 18a and a second lower arm 18b joined by a bight portion 18c has first and second slide projections 18d,18e extending outwardly from the bight portion which are slidingly received in respective slots 16c,16d. A tongue 18f is formed on bight portion 18c extending essentially along its entire length and is slidingly received in groove 16a of second leg 16 of T-shaped member 12. Threaded bores 18g are formed through projections 18d,18e for reception of screws 20 having heads with a diameter greater than the width of slots 16c,16d and with the heads received over face surface 16e to slidingly and lockingly couple the U-shaped bracket to the T-shaped member. A rail seat 18k is formed in arms 18a,18b for sliding reception of a suitable rail 2 of the type shown in FIG. 1. A threaded bore 18m in arm 18a is aligned with seat 18k and receives a set screw 22 to lock bracket 18 to the rail at a selected location in the X direction.

A pin member 24 has an annular groove 24a formed adjacent one end 24b thereof and a cylindrical slide portion 24c extending from groove 24a toward the opposite end 24d of the pin member. Slide portion 24c is slidingly received through a bore 18p formed in arm 18b with annular groove 24a received in slot 14a of leg 14 of T-shaped member 12. An elongated threaded member 24e is fixedly attached to pin member 24 and extends along the longitudinal axis of the pin member from end 24d of the pin member. Threaded member 24e is threadingly received in threaded bore 18n formed in arm 18a of U-shaped bracket 18 so that rotational movement of threaded member 24e, with annular groove 24a locked in slot 14a will cause T-shaped member 12 to move in the Z direction, i.e., vertically as seen in FIGS. 2, 3 between an upper extremity shown in FIG. 2 and a lower extremity shown in FIG. 3. A knob 24f is preferably provided at the free distal end of threaded member 24e to facilitate rotational movement so that the T-shaped member can be readily adjusted to any selected position in the Z direction between the FIGS. 2 and 3 extremities. A lock nut 26 is preferably received on threaded member 24e between knob 24f and arm 18a of bracket 18. Preferably, a compression spring 26 is placed about threaded member 24e between end 24d which serves as a spring seat and arm 18a to maintain a bias on threaded member 24e in the same direction, e.g., downwardly as seen in FIGS. 2, 3. This takes up any slack or looseness between the male thread of member 24e and the female thread of T-shaped member 12.

As shown in FIGS. 2, 3, a selected test head 30 is mounted by any suitable means on a seat on the lower surface of first base leg 14, as seen in FIGS. 2, 3, as by use of screw members 32 received through slot 14b and into a respective bore (not shown) in a base 30a of the test head. A conventional two wire insulated lead 34 is received through slot 14b and a suitable aperture in base 30a so that the leads can be suitably attached to circuit board or ground plane 30b depending on the type of test head employed. It will be understood that various types of test heads can be mounted on T-shaped member 12 such as the magnetic inducer or capacitive probe referenced above.

Figure 11:
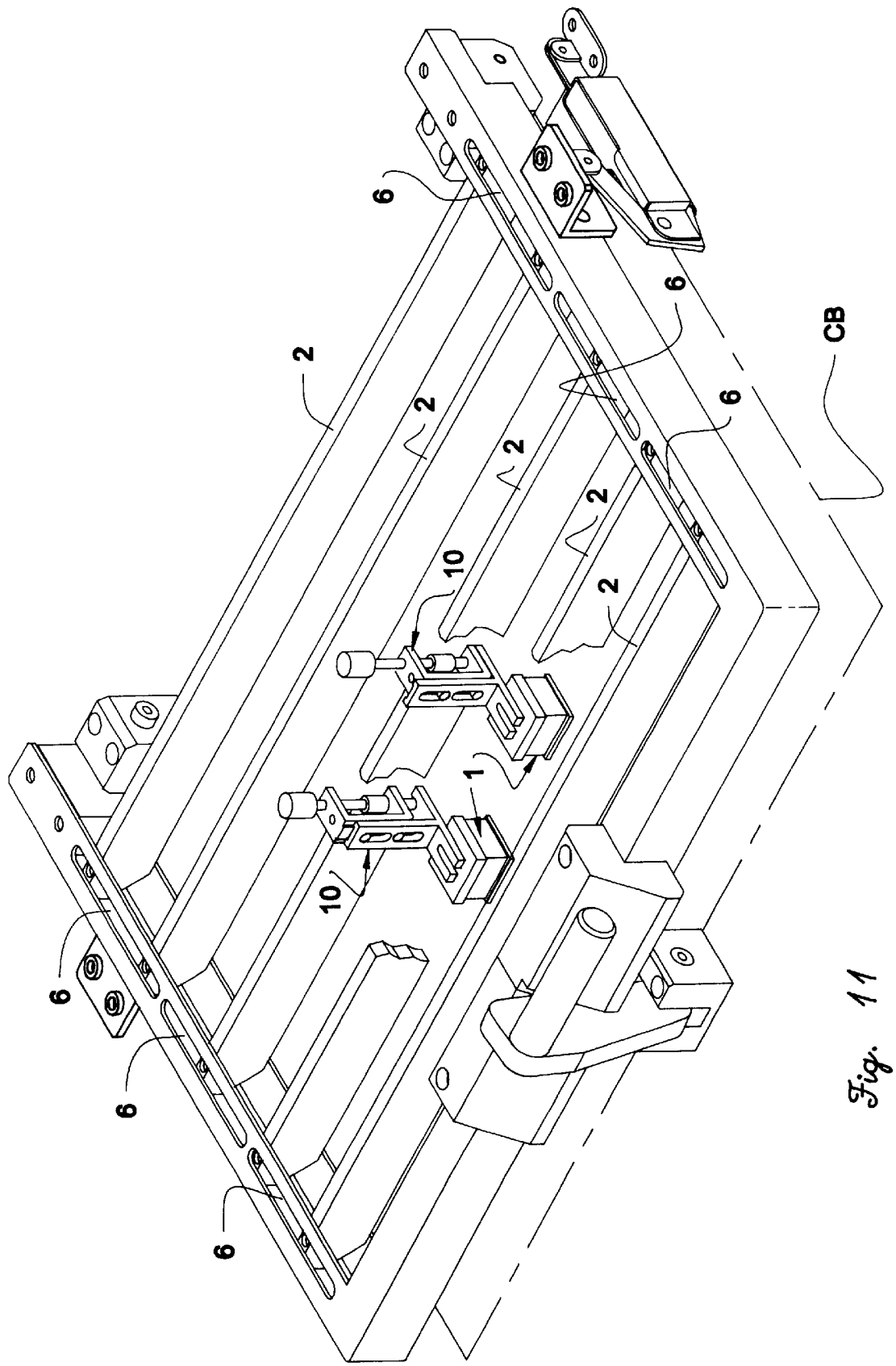
FIG. 11 is a perspective view, similar to FIG. 1 but showing two mounting devices made in accordance with the invention mounted in a test fixture with certain parts omitted for purposes of illustration.

Thus it will be seen that the invention provides apparatus which can be accurately positioned in the x direction on a rail, as seen in FIG. 11, and precisely adjusted in the z direction without any interference from similar neighboring mounting devices. By means of the invention, set-up time for a given board is greatly reduced compared to prior art techniques.

FIG. 12 shows a resinous mounting plate 40 which can be used to mount devices 10 made in accordance with the invention to obtain the desired Z direction adjustment instead of using conventional rails 2. Plate 40 is attached to the test fixture using appropriate hardware 42 and is provided with a plurality of aperture sets 40a for mounting devices 10. Although only three sets of apertures 40a are shown it will be understood that any desired number can be provided in both the X and the Y directions. Each set includes a first bore 40b for reception of elongated member 24e, a second bore 40c for reception of a screw (not shown) which is received in bore 18m used to affix device 10 to plate 40, a slot 40d for reception of the upper portion of leg 16 in the upper position of T-shaped member 12, and bore 40e to provide access to screws 32 (not shown in FIG. 12) to allow adjustment of a head in slot 14b.

Although the invention has been described with regard to a specific preferred embodiment thereof, variations and modifications will become apparent to those skilled in the art. For example, the tongue and groove arrangement of the bight portion 18c and leg 16 can be reversed with the tongue formed on leg 16 and the groove formed in bight portion 18c, if desired. Further, although two slots 16c,16d are shown in leg 16 it will be understood that a single elongated slot could be used with both slide projections received therethrough, if desired. The use of material such as PVC for T-shaped member 12 and aluminum for bracket 18 is particularly advantageous in providing smooth, low friction movement, however, the use of other materials is within the purview of the invention. Although pin member 24 is shown with groove 24a for reception in slot 14a, the pin could be attached to base leg 14 by other means, such as by a screw received through a bore in base leg 14 and into an axially extending bore formed in pin member 24 or a reduced diameter portion of the pin member could be received in a bore in base leg 14 and locked there by means of a washer and a screw in an axially extending bore formed in pin member 24. It will also be understood that T-shaped member 12 could, if desired, be formed as an L-shaped member with both the pin member and the test head mounted on the base leg thereof. The mounting device, although particularly adapted to mount test heads of the type described supra, can be employed to mount various devices, such as sensors, transducers and even tools. It is, therefore, the intention that the appended claims be interpreted as broadly as possible in view of the prior art to include all such variations and modifications.

What is claimed:

1. A mounting device for a test head for vectorless testing of integrated circuit components and the like comprising
    a mounting member having a first laterally extending base leg, a test head seat formed on the first leg for mounting the test head, a second leg extending upwardly from the first leg along a length to a distal end, at least one slot formed through the second leg and extending along a portion of the length of the second leg,
    a generally U-shaped bracket having upper and lower arms extending from a bight portion and guide projections extending from the bight portion and received in the at least one slot, a threaded bore formed through the upper arm and a smooth bore formed through the lower arm,
    a pin member having opposite ends and a longitudinal axis, a threaded portion extending along the longitudinal axis to a distal free end, the threaded portion threadingly received in the threaded bore in the upper arm and the pin member slidingly received through the bore in the lower arm with the other end of the pin member rotatably attached to the base leg, whereby rotating movement of the threaded portion will cause vertical (z) movement of the mounting member and concomitantly the seat.

2. A mounting device according to claim 1 further comprising one of a tongue and groove formed in the second leg of the mounting member extending along at least a portion of the length of the second leg and the other of the tongue and groove formed in the bight portion, the tongue slidingly received in the groove.

3. A mounting device according to claim 1 further comprising a rail seat formed in the bracket between the upper and lower arms to slidingly receive the rail, another threaded bore is formed through the upper arm aligned with the rail seat and a set screw is received in the another threaded bore for fixing the position of the mounting device on a rail received in the rail seat.

4. A mounting device according to claim 1 further including a magnetic inducer head mounted on the seat on the first base leg.

5. A mounting device according to claim 1 further including a capacitive probe head mounted on the seat on the first base leg.

6. A mounting device according to claim 1 in which a threaded bore is formed in each guide projection and a screw having a head with a diameter greater than the width of the at least one slot is received in each threaded bore in the guide projections so that the heads of the screws extend over a portion of a side of the second leg opposite to the bight portion.

7. A mounting device according to claim 1 further comprising a knob formed at the distal free end of the threaded portion.

8. A mounting device according to claim 1 in which the mounting member is formed of plastic material and the U-shaped bracket is formed of metal.

9. A mounting device according to claim 1 in which a slot is formed at an end of the first base leg of the mounting member and an annular groove is formed adjacent to the other end of the pin member, the annular groove being received in the slot of the first base leg.

10. A mounting device for a test head for vectorless testing of integrated circuit components and the like having a test fixture with a mounting surface and at least one rail movably mounted above the mounting surface, the rail being positioned at a selected point along a Y direction relative to mutually perpendicular axes X,Y and Z, comprising
    a generally T-shaped member having a first laterally extending base leg, a test head seat formed on the base leg for mounting the test head and a second leg extending upwardly from the first leg along a length to a distal end, at least one slot formed through the second leg and extending along a portion of the length of the second leg,
    a generally U-shaped bracket having upper and lower arms extending from a bight portion and guide projections extending from the bight portion and received in the at least one slot, a threaded bore formed through the upper arm and a smooth bore formed through the lower arm,
    one of a tongue and groove formed in the second leg of the T-shaped member extending along at least a portion of the length of the second leg and the other of the tongue and groove formed in the bight portion, the tongue slidingly received in the groove,
    a pin member having opposite ends and a longitudinal axis, a threaded portion extending along the longitudinal axis to a distal free end, the threaded portion threadingly received in the threaded bore in the upper arm and the pin member slidingly received through the bore in the lower arm and coupled to the base leg, a knob formed on the distal free end of the threaded portion and a test head seat formed on the base leg of the T-shaped member, a rail seat formed in the bracket between the upper and lower arms to slidingly receive a rail, whereby rotating movement of the threaded portion will cause vertical (z) movement of the T-shaped member and concomitantly the test head seat.

11. A mounting device according to claim 10 further comprising a magnetic inducer head mounted on the test head seat.

12. A mounting device according to claim 10 further comprising a capacitive probe head mounted on the test head seat.

13. A mounting device according to claim 10 further including a resinous mounting plate having a plurality of sets of bores therethrough, each set including a first bore for reception of the threaded portion extending from the pin member and a second bore aligned with another threaded bore in the upper arm of the U-shaped bracket for reception of a screw to affix the mounting device to the resinous mounting plate.

14. A mounting device for a test head for vectorless testing of integrated circuit components and the like comprising a mounting member having a first laterally extending base leg, a test head seat formed on the base leg for mounting the test head and a second leg extending upwardly from the first leg along a length to a distal end, at least one slot formed through the second leg and extending along a portion of the length of the second leg, a generally U-shaped bracket having upper and lower arms extending from a bight portion and guide projections extending from the bight portion and received in the at least one slot, a threaded bore formed through the upper arm and a smooth bore formed through the lower arm, one of a tongue and groove formed in the second leg of the mounting member extending along at least a portion of the length of the second leg and the other of the tongue and groove formed in the bight portion, the tongue slidingly received in the groove, a pin member having opposite ends and a longitudinal axis, a threaded portion extending at one end along the longitudinal axis to a distal free end, the threaded portion threadingly received in the threaded bore in the upper arm and the pin member slidingly received through the bore in the lower arm with the other end of the pin member attached to the base leg, and a test head seat formed on the base leg of the mounting member, a rail seat formed in the bracket between the upper and lower arms to slidingly receive a rail, whereby rotating movement of the threaded member will cause vertical (Z) movement of the T-shaped member and concomitantly the test head seat.

15. A mounting device according to claim 14 further comprising a magnetic inducer head mounted on the test head seat.

16. A mounting device according to claim 14 further comprising a capacitive probe head mounted on the sets head seat.

* * * * *